United States Patent [19]

Li

[11] Patent Number: 5,603,849

[45] Date of Patent: Feb. 18, 1997

[54] METHODS AND COMPOSITIONS FOR CLEANING SILICON WAFERS WITH A DYNAMIC TWO PHASE LIQUID SYSTEM WITH HYDROFLUORIC ACID

[75] Inventor: Li Li, Meridian, Id.

[73] Assignee: Micron Technology, Inc., Boise, Id.

[21] Appl. No.: 559,723

[22] Filed: Nov. 15, 1995

[51] Int. Cl.$^6$ ........................................ C23G 1/00
[52] U.S. Cl. .............................. 216/99; 216/93; 216/109; 252/79.3; 252/79.4; 134/2; 134/3
[58] Field of Search ............................ 134/1.3, 2, 3, 26, 134/28; 216/93, 99, 109; 252/79.3, 79.4; 156/662.1, 642.1

[56] References Cited

U.S. PATENT DOCUMENTS

| | | | |
|---|---|---|---|
| 2,737,499 | 3/1956 | Grubb | 252/79.3 |
| 3,979,241 | 9/1976 | Maeda et al. | 252/79.3 |
| 4,619,706 | 10/1986 | Squires et al. | 134/2 |
| 4,871,422 | 10/1989 | Scardera et al. | 156/662.1 |
| 4,885,056 | 12/1989 | Hall et al. | 156/662.1 |
| 5,320,709 | 6/1994 | Bowden et al. | 134/1.3 |
| 5,381,807 | 1/1995 | Lee | 134/2 |
| 5,498,293 | 3/1996 | Ilardi et al. | 134/3 |
| 5,509,970 | 4/1996 | Shiramizu | 134/3 |

Primary Examiner—R. Bruce Breneman
Assistant Examiner—Anita Alanko
Attorney, Agent, or Firm—Workman Nydegger & Seeley

[57] ABSTRACT

Methods and compositions are disclosed for cleaning oxides and metals from surfaces of silicon wafers in a two-phase liquid system. The two-phase system comprises a fluorine containing oxide etchant, such as hydrofluoric acid, that is soluble within two immiscible liquids of different densities such that the two liquids form separate layers. Silicon wafers are immersed into the top layer which is a nonpolar organic liquid. The bottom layer is polar liquid, preferably water. The nonpolar organic liquid includes ketones, ethers, alkanes and alkenes, but is preferably pentanone. Metal ions are transported from surfaces of the silicon wafers through the pentanone top layer to the polar water bottom layer, thereby eliminating metal ions from the pentanone. Due to relative solubilities, the concentration of hydrofluoric acid in the water bottom layer is greater than in the pentanone top layer. The differences in concentrations extend the lifetime of the system since the hydrofluoric acid in the water bottom layer is transported by equilibrium forces to the pentanone top layer as hydrofluoric acid is consumed cleaning oxides from the surfaces of the silicon wafers.

20 Claims, No Drawings

METHODS AND COMPOSITIONS FOR CLEANING SILICON WAFERS WITH A DYNAMIC TWO PHASE LIQUID SYSTEM WITH HYDROFLUORIC ACID

BACKGROUND OF THE INVENTION

1. The Field of the Invention

The present invention is directed to methods and compositions for cleaning silicon wafers in a two-phase liquid system with hydrofluoric acid. The system has two layers of immiscible liquids both of which contain hydrofluoric acid. Silicon wafers are cleaned by hydrofluoric acid in the top layer which is a nonpolar organic liquid. Metals from the silicon wafers and/or from the nonpolar organic liquid travel from the top layer to the bottom layer which is water. Treatment of silicon wafers in the inventive two-phase liquid system with hydrofluoric acid prevents metal and oxide deposits on the surfaces of the silicon wafers.

2. The Relevant Technology

In the microelectronics industry, methods for cleaning silicon wafers are continually being developed and optimized to meet the stringent demands for wafers having clean and smooth surfaces. As the device features continuously decrease to the deep sub-micron region, the product yield and device performance become even more dependent on the wafer cleaning technology.

A clean, chemically stable, and atomically uniform silicon surface is desirable prior to gate oxidation and silicon epitaxial growth in advanced ultra large-scale integration (ULSI) fabrication. It is well-known that metallic contamination on silicon surfaces can cause fatal effects on semiconductor devices. The metallic contamination on a silicon surface is preferably suppressed to less than 1E+10 atoms/$cm^2$ in order to prevent defects.

Wet chemical processing, particularly hydrofluoric acid (HF) cleaning, continues to be a prevalent cleaning method in ULSI manufacturing despite difficulties in minimizing metallic contamination. Hydrofluoric acid is widely used as a wet etchant since silicon wafers are thereby obtained which have clean, chemically stable, and atomically uniform silicon surfaces. After aqueous hydrofluoric acid treatment, the surfaces of a silicon wafer are hydrogen-passivated bare silicon surfaces. Hydrofluoric acid treatment removes thermal and native oxides and is therefore an essential cleaning procedure and processing step of device fabrication.

During hydrofluoric acid wafer cleaning, metals including noble metals, have been found deposited on wafer surfaces by oxidation-reduction reactions resulting in severely deteriorated device performances. Some of the metals which are found deposited on silicon surfaces include copper, iron, calcium, potassium, magnesium, aluminum and nickel.

Metal deposition has been prevented by the addition of strong oxidizing agents such as ozone and hydrogen peroxide. Strong oxidizing agents such as ozone and hydrogen peroxide are useful for the prevention of metal deposition; however, the surface of the silicon wafers are also thereby reoxidized.

It has been postulated that metal deposition results when electrons are transferred from the silicon to the metal ion. Analysis of the deposition of copper (Cu), which has been a particular problem, provides an example of the mechanisms involved in metal deposition. The reaction in which a $Cu^{2+}$ ion in a solution is metalized by taking electrons can be expressed by the following oxidation-reduction reaction equation: $Cu^{2+}+2e^-=Cu$. The redox potential (E°) of the metalization of a $Cu^{2+}$ ion is 0.337 V. The reaction in which silicon in an aqueous solution releases electrons can be expressed by the following equation: $SiO_2+4H^++4e^-=Si+2H_2O$. The redox potential for the reaction of silicon in an aqueous solution is −0.857 V. A $Cu^{2+}$ ion, which has a higher redox potential than silicon, takes electrons, is reduced to metallic copper, and is deposited onto a silicon surface. Silicon, which features a lower redox potential than the $Cu^{2+}$ ion, releases electrons and is oxidized to become silicon dioxide ($SiO_2$). The copper deposition onto a silicon surface in the solution is essentially induced by the oxidation-reduction reaction between silicon and copper ions. Pits found where copper particles deposit on the silicon surface in a diluted hydrofluoric acid solution provides evidence of this $SiO_2$ formation.

A pit produced when silicon dioxide ($SiO_2$) formed in the oxidation-reduction reaction is etched away by a diluted hydrofluoric acid solution is referred to as a Metal Induced Pit (MIP). The mechanism of metal deposition onto silicon surfaces in solutions begins with metal ions in the vicinity of a silicon surface withdrawing electrons from the silicon and becoming precipitated in a form of a metal such as metallic copper (Cu). It has been postulated that a nucleus of a metal particle is formed. When the metal nucleus adhering on the silicon surface features higher electronegativity than silicon, it attracts electrons from the silicon to become negatively charged. Other metal ions coming closer to the silicon surface gain electrons from the negatively-charged (electron-rich) metal nucleus and are precipitated around it. Accordingly, the metal nucleus grows into a larger particle on the silicon surface as more metal ions are precipitated. The silicon surface underneath the metal particles releases as many electrons as required by the metal ions to be charged, while $SiO_2$ is thereby formed. In a diluted hydrofluoric acid solution, the formed $SiO_2$ is etched away immediately and a MIP is made.

The metal nucleus is considered to be made where a silicon surface is electrically active. Electron exchange between metal ions and silicon is more likely to take place at kinks, steps, and areas where halide ions are adsorbed because these areas are more electrically active than the hydrogen-terminated areas on a silicon surface. The promotion of metal deposition by a trace level of halogen ions in hydrofluoric acid solutions can be explained by this mechanism.

A typical MIP formed from metallic impurities is about 0.1 μm in diameter, which is also almost the same as a copper particle size. The depth of a typical MIP from peak to valley is about 8 nm. The MIP size can be fatal to device performance when it is considered that the thickness of a typical gate oxide is 8 to 15 nm.

One of the primary disadvantages of conventional wet chemical processing is the inability to eliminate the presence of metals from the wet etchant. Silicon wafers cleaned in a bath of wet etchant introduce metals into the bath. The concentration of metals within the bath increases as the bath cleans the silicon wafers. The bath must be eventually replaced when the metal concentration becomes too high.

The lifetime of a bath containing hydrofluoric acid is also relatively short when used to achieve a controlled etch. The concentration of hydrofluoric acid in a bath prepared for controlled etching is relatively low and must remain in a relatively narrow concentration range. The hydrofluoric acid is quickly consumed by the etching of the silicon wafers and must be replenished when the concentration approaches the lower limit of the narrow concentration range. There are no compositions or methods currently available which provide for the prevention of metal deposition and also the minimization of silicon surface reoxidation.

There are also no compositions or methods which extend the usefulness of hydrofluoric acid baths.

SUMMARY AND OBJECTS OF THE INVENTION

The present invention is directed to methods and compositions for cleaning silicon wafers in a two-phase liquid system with a wet etchant. Treatment of silicon wafers in the two-phase liquid system with the wet etchant which is a fluorine-containing oxide etchant such as hydrofluoric acid, prevents metal deposition and oxides on the surfaces of the silicon wafers. Such treatment has an increased lifetime compared to one phase wet etchant systems comprising solely aqueous hydrofluoric acid. The inventive system comprises a fluorine containing oxide etchant, such as hydrofluoric acid, in two immiscible liquids which have separated into two phases or layers. The top layer is a nonpolar organic liquid and the bottom layer is a polar liquid such as water.

The method of the present invention involves obtaining a silicon wafer, preparing a two layer liquid system having a layer of a nonpolar organic liquid and a layer of water, and then placing the silicon wafer in the nonpolar organic liquid to clean the silicon wafer. The nonpolar organic liquid and water are substantially immiscible. The fluorine containing oxide etchant, such as hydrofluoric acid, is soluble within both the nonpolar organic liquid and the polar liquid.

To initiate the cleaning process, the two layered liquid system is prepared. The wet etchant may be added to the system, and may also be permitted to reach an equilibrium state within the two layer liquid system. Due to the relative densities of the layers, the nonpolar organic liquid is above the layer of polar liquid. By using a nonpolar organic liquid that is less dense than the polar liquid, the silicon wafers can be placed into the nonpolar organic liquid by merely immersing into the first layer of the two layered liquid system. Thus, the silicon wafers are then placed in the nonpolar organic liquid layer that has the wet etchant, such as hydrofluoric acid, therein. During the cleaning of the wafers within the two layer liquid system, deposition of metals onto the silicon wafer is prevented, and oxidation of the silicon wafer is minimized as well. The metals are transported to the polar liquid (e.g. water) as the metals are more soluble in the polar liquid. This transportation of metals eliminates the metals from the nonpolar organic liquid.

The nonpolar organic liquid is preferably selected from the group consisting of ketones, ethers, alkanes and alkenes. The nonpolar organic liquid is most preferably pentanone.

The wet etchant, which is a fluorine containing oxide etchant such as hydrofluoric acid, is preferably more soluble in the polar liquid than in the nonpolar organic liquid. This assures that the concentration of the wet etchant in the polar liquid will be greater than its concentration in the nonpolar organic liquid. It is preferable to maintain a greater concentration of the wet etchant in polar liquid to lengthen the lifetime of the two-layered system, since the wet etchant in the polar liquid will be transported to the nonpolar organic liquid until the two layered system reaches equilibrium. Upon introduction of wafers into the nonpolar organic solvent, the wet etchant in the nonpolar organic liquid is consumed as wafers are cleaned, and the wet etchant in the water replenishes the wet etchant in the nonpolar organic solvent. It is also within the scope of the present invention to add additional wet etchant to the nonpolar organic liquid to replace the wet etchant that is consumed by the reaction of the wet etchant while cleaning the silicon wafers.

From the foregoing it will be appreciated that an object of the present invention is to provide methods for cleaning a silicon wafer without depositing metal contaminants such as copper onto the surfaces of the silicon wafer.

It is also an object of the present invention to provide methods for cleaning a silicon wafer that prevent metal deposition while minimizing reoxidation of the surfaces of the silicon wafer.

Additionally, it is a further object of the present invention to provide compositions and methods which extend the usefulness of wet etchant systems.

These and other objects and features of the present invention will become more fully apparent from the following description and appended claims, or may be learned by the practice of the invention as set forth hereinafter.

DETAILED DESCRIPTION OF THE PREFERRED EMBODIMENTS

The present invention is directed to methods and compositions for cleaning oxides and metals from silicon wafers in a two-phase liquid system with a wet etchant. The wet etchant is a fluorine containing oxide etchant, preferably hydrofluoric acid. The two-phase liquid system comprises two immiscible liquids which have different densities so as to separate into two phases or layers. The top layer will preferably be a nonpolar organic liquid, and the bottom layer will be a polar liquid, preferably water. The wet etchant will preferably be highly concentrated in the polar liquid and have little concentration in the nonpolar organic liquid.

Once the two-phase liquid system has been prepared, the silicon wafers are cleaned by placing the wafers in the top layer. The wet etchant in the top layer is consumed as the wet etchant etches oxides from the surfaces of the silicon wafers. Thus, oxidation of the silicon wafer surfaces is minimized by this method. As the wet etchant is consumed from the top layer, the top layer is simultaneously replenished from the high concentration of wet etchant in the bottom layer. The replenishment of wet etchant from the bottom layer to the top layer is drive by equilibrium in the relative concentrations of the wet etchant. When the wet etchant reaches an equilibrium in both the nonpolar organic liquid and the polar liquid, there is a constant ratio of the concentration therebetween.

While the wet etchant in the top layer etches oxides from the silicon wafers, metals on the silicon wafers are ionized in the nonpolar organic liquid of the top layer. Metal ions in the nonpolar organic liquid travel through the top layer to the polar liquid in the bottom layer. The metal ions are more attracted to the polar liquid of the bottom layer than they are to the nonpolar organic liquid of the top layer. Thus, metal ions will continuously be removed from the wafers during the cleaning process. After the silicon wafers have been cleaned, the wafers are preferably drawn from the nonpolar organic liquid, rinsed and dried.

Any nonpolar organic liquid is within the scope of the present invention which is immiscible in polar liquids, such as water, where a fluorine containing oxide etchant is soluble in both the nonpolar organic liquid and in the polar liquid. The nonpolar organic liquid is preferably selected from the group consisting of ketones, ethers, alkanes, alkenes. The nonpolar organic liquid will preferably have long carbon chains, such as does pentanone which is most preferred.

While it is within the scope of this invention that the nonpolar organic liquid be more dense than the polar liquid, it is preferred that the nonpolar organic liquid be less dense than the polar liquid, thereby enabling the nonpolar organic liquid to be the top layer. When the top layer is the nonpolar organic liquid, then the silicon wafers can be immersed into the nonpolar organic liquid without also being immersed into the polar liquid layer which is increasingly contaminated with metal ions as the cleaning process progresses.

The wet etchant is preferably more soluble in the polar liquid than in the nonpolar organic liquid. By selecting a nonpolar organic liquid having a lower solubility for the wet etchant than in a selected polar liquid such as water, the concentration of the wet etchant will be higher in the polar liquid than in the nonpolar organic liquid. When the concentration of the wet etchant is higher in the polar liquid, a reservoir of the wet etchant is kept in the polar liquid to replace the wet etchant in the nonpolar organic liquid. Thus, the wet etchant is consumed as it etches oxides from the silicon wafer surfaces and the wet etchant is simultaneously replenished.

With respect to relative concentrations of the wet etchant in the polar liquid and the nonpolar organic liquid, it is desirable to have a much greater concentration of the wet etchant in the polar liquid, such as water, than in the nonpolar organic liquid. This significant difference in relative concentration is to maintain the concentration of the wet etchant, such as hydrofluoric acid, in a useful range for a longer period of time than is possible in an etch bath with only one phase. In an etch bath with only one phase, such as a dilute solution of aqueous hydrofluoric acid, hydrofluoric acid must be added to the bath to maintain the concentration in a desired range. The necessity of adding hydrofluoric acid to a bath requires that the concentration be closely monitored, particularly when the concentration must be in a narrow range. While hydrofluoric acid can be added to the system of the present invention as in a conventional single phase etch bath, such additions are not necessary in that the inventive two-phase system provides an automatic replenishment of the wet etchant by equilibrium force from the polar liquid to the nonpolar organic liquid of the two layer bath.

The ability of the two-phase system of the present invention to continually transport wet etchant from the polar liquid layer to the nonpolar organic liquid layer is particularly advantageous when a controlled etch is desired. A controlled etch typically necessitates that the concentration of wet etchant be maintained in a low range which is relatively narrow. It is easier to maintain the wet etchant in the nonpolar organic liquid layer in a narrow concentration range when the required concentration is low. This is due to the result of a low concentration in the nonpolar organic liquid layer which is a high ratio between the concentration of wet etchant in the nonpolar organic liquid layer and the polar liquid layer. In the most preferred embodiment for achieving a controlled etch, the concentration of the wet etchant, such as hydrofluoric acid, in the nonpolar organic liquid of pentanone is in a range of about 0.1%–3%, and the concentration of the hydrofluoric acid in the polar liquid of water is about 49%.

Utilizing hydrofluoric acid as a wet etchant is preferred, although $NH_4F$ or $NH_4F$ in combination with HF can also be used as the wet etchant. In general, a fluorine containing oxide etchant that is soluble in both the selected polar liquid and the nonpolar organic liquid is a desirable wet etchant for the present inventive method.

Accordingly, an advantage of the present invention is a longer lifetime and a greater usefulness for a silicon wafer cleaning bath compared to a conventional silicon wafer cleaning bath utilizing a single liquid phase with aqueous hydrofluoric acid as a wet etchant. Additionally, the present invention minimizes metallic deposits and oxides on silicon surfaces of wafers.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of cleaning a silicon wafer, the method comprising the steps of:
   preparing a two layer liquid system having a layer of a nonpolar organic liquid and a layer of a polar liquid, the nonpolar organic liquid and the polar liquid being substantially immiscible, wherein a wet etchant comprising a fluorine containing oxide etchant is soluble and is within both the nonpolar organic liquid and the polar liquid; and
   placing the silicon wafer in the nonpolar organic liquid to clean oxides and metals from surfaces on the silicon wafer.

2. A method of cleaning a silicon wafer as defined in claim 1, wherein the nonpolar organic liquid is pentanone.

3. A method of cleaning a silicon wafer as defined in claim 2, wherein the polar liquid is water.

4. A method of cleaning a silicon wafer as defined in claim 1, wherein the nonpolar organic liquid has a lower density than the polar liquid such that the layer of nonpolar organic liquid is above the layer of the polar liquid.

5. A method of cleaning a silicon wafer as defined in claim 1, wherein the nonpolar organic liquid is selected from the group consisting of ketones, ethers, alkanes and alkenes.

6. A method of cleaning a silicon wafer as defined in claim 5, wherein the nonpolar organic liquid is pentanone.

7. A method of cleaning a silicon wafer as defined in claim 1, wherein the wet etchant is more soluble in the polar liquid than in the nonpolar organic liquid.

8. A method of cleaning a silicon wafer as defined in claim 7, wherein the concentration of the wet etchant in the polar liquid is about less than 50% and the concentration of the wet etch ant in the nonpolar organic liquid not greater than 3%.

9. A method of cleaning a silicon wafer as defined in claim 8, wherein the wet etchant is hydrofluoric acid, the nonpolar organic liquid is pentanone, and the polar liquid is water, and wherein the concentration of hydrofluoric acid in the water is about 49% and the concentration of hydrofluoric acid in the pentanone is in a range of about 0.1%–3%.

10. A method of cleaning a silicon wafer as defined in claim 3, wherein the nonpolar organic liquid is pentanone, and the wet etchant is selected from the group consisting of hydrofluoric acid and $NH_4F$.

11. A method of cleaning a silicon wafer as defined in claim 1, further comprising the step of adding wet etchant to the nonpolar organic liquid to replace the wet etchant consumed as the wet etchant cleans oxides from the surfaces of the silicon wafer.

12. A method of cleaning a silicon wafer as defined in claim 1, further comprising the step of drawing the silicon wafer from the nonpolar organic liquid for rinsing and drying.

13. A method of cleaning a silicon wafer, the method comprising the steps of:

preparing a two layer liquid system having a layer of a nonpolar organic liquid and a layer of water; the nonpolar organic liquid and water being substantially immiscible, the nonpolar organic liquid having a lower density than water such that the layer of nonpolar organic liquid is above the layer of water, wherein a wet etchant comprising a fluorine containing oxide etchant is within the nonpolar organic liquid and the water, and wherein the wet etchant is more soluble in the water than in the nonpolar organic liquid; and immersing the silicon wafer in the nonpolar organic liquid to clean oxides and metals from surfaces on the silicon wafer.

14. A method of cleaning a silicon wafer as defined in claim 13, wherein the nonpolar organic liquid is selected from the group consisting of ketones, ethers, alkanes and alkenes.

15. A method of cleaning a silicon wafer as defined in claim 13, wherein the nonpolar organic liquid is pentanone.

16. A method of cleaning a silicon wafer as defined in claim 13, wherein the wet etchant is hydrofluoric acid.

17. A method of cleaning a silicon wafer, the method comprising the steps of:

preparing a two layer liquid system having a layer of a nonpolar organic liquid selected from the group consisting of ketones, ethers, alkanes and alkenes and having a layer of a polar liquid, the nonpolar organic liquid and the polar liquid being substantially immiscible, the nonpolar organic liquid having a lower density than the polar liquid such that the layer of nonpolar organic liquid is above the layer of the polar liquid, wherein a fluorine containing oxide etchant is within both the nonpolar organic liquid and the polar liquid, and wherein the fluorine containing oxide etchant is more soluble in the polar liquid than in the nonpolar organic liquid; and immersing the silicon wafer in the nonpolar organic liquid to clean oxides and metals from the surfaces of the silicon wafer.

18. A method of cleaning a silicon wafer as defined in claim 17, wherein the polar liquid is water.

19. A method of cleaning a silicon wafer as defined in claim 18, wherein the nonpolar organic liquid is pentanone.

20. A method of a silicon wafer as defined in claim 19, wherein the fluorine containing oxide etchant is hydrofluoric acid.

* * * * *